(12) United States Patent
Setoguchi (10) Patent No.: US 9,130,149 B2
(45) Date of Patent: Sep. 8, 2015

(54) PIEZOELECTRIC ACTUATOR FOR SUPPRESSING DISCONNECTION

(75) Inventor: Tsuyoshi Setoguchi, Kirishima (JP)

(73) Assignee: Kyocera Corporation, Kyoto (JP)

( * ) Notice: Subject to any disclaimer, the term of this patent is extended or adjusted under 35 U.S.C. 154(b) by 311 days.

(21) Appl. No.: 13/807,754

(22) PCT Filed: Aug. 26, 2011

(86) PCT No.: PCT/JP2011/069249
§ 371 (c)(1),
(2), (4) Date: Feb. 26, 2013

(87) PCT Pub. No.: WO2012/026564
PCT Pub. Date: Mar. 1, 2012

(65) Prior Publication Data
US 2013/0162107 A1 Jun. 27, 2013

(30) Foreign Application Priority Data

Aug. 26, 2010 (JP) ................. 2010-189600

(51) Int. Cl.
*H01L 41/083* (2006.01)
*H01L 41/053* (2006.01)
(Continued)

(52) U.S. Cl.
CPC ........ *H01L 41/0536* (2013.01); *B23K 11/0033* (2013.01); *B23K 26/206* (2013.01); *B23K 26/3206* (2013.01); *B23K 26/3233* (2013.01); *B23K 33/00* (2013.01); *B41J 2/14201* (2013.01); *B41J 2/14233* (2013.01); *H01L 41/23* (2013.01); *B23K 2201/04* (2013.01); *B23K 2201/36* (2013.01); *B23K 2203/04* (2013.01);
(Continued)

(58) Field of Classification Search
CPC .. H01L 41/056; H01L 41/083; H01L 41/0838
USPC .................................................. 310/328, 366
See application file for complete search history.

(56) References Cited

U.S. PATENT DOCUMENTS 5,113,108 A * 5/1992 Yamashita et al. ............ 310/328
5,239,223 A 8/1993 Miyoshi
(Continued)

FOREIGN PATENT DOCUMENTS

CN 101438051 A 5/2009
DE 19912334 A1 9/2000
(Continued)

OTHER PUBLICATIONS

Chinese Office Action with English concise explanation, Chinese Patent Appln. No. 201180024018.X, Apr. 23, 2014, 6 pp.
(Continued)

*Primary Examiner* — J. San Martin
(74) *Attorney, Agent, or Firm* — Volpe and Koenig, P.C.

(57) ABSTRACT

A piezoelectric actuator of the invention includes a piezoelectric element, a base body having an upper face on which a lower end of the piezoelectric element abuts, and a case having an inner face on which an upper end of the piezoelectric element abuts, the case being configured to enclose the piezoelectric element, wherein the case includes a flange portion configured to be joined to the base body, and at least two bent portions are present on an inner face that is formed from a lower face of the flange portion of the case to the upper face of the base body on an enclosure space side of a junction between the case and the base body.

4 Claims, 5 Drawing Sheets

(51) Int. Cl.
*B23K 11/00* (2006.01)
*B23K 26/20* (2014.01)
*B23K 26/32* (2014.01)
*B23K 33/00* (2006.01)
*B41J 2/14* (2006.01)
*H01L 41/23* (2013.01)

(52) U.S. Cl.
CPC .... *B41J2002/14491* (2013.01); *H01L 41/0533* (2013.01); *H01L 41/083* (2013.01)

(56) References Cited

U.S. PATENT DOCUMENTS

| | | | |
|---|---|---|---|
| 5,272,797 A | | 12/1993 | Miyoshi et al. |
| 5,334,902 A * | | 8/1994 | Inoi ................. 310/344 |
| 5,477,102 A * | | 12/1995 | Miyoshi ................. 310/344 |
| 6,333,587 B1 | | 12/2001 | Heinz et al. |
| 6,465,936 B1 * | | 10/2002 | Knowles et al. ............. 310/328 |
| 7,429,815 B2 * | | 9/2008 | Gibson et al. ................. 310/344 |
| 7,898,152 B2 * | | 3/2011 | Stocker et al. ................. 310/328 |
| 8,193,686 B2 * | | 6/2012 | Cooke ........................... 310/348 |
| 8,678,299 B2 * | | 3/2014 | Ham et al. ................. 239/102.2 |
| 2009/0096324 A1 | | 4/2009 | Kronberger |
| 2014/0062264 A1 * | | 3/2014 | Moessner et al. ............. 310/365 |

FOREIGN PATENT DOCUMENTS

| | | | | |
|---|---|---|---|---|
| DE | 102009026532 A1 * | 12/2010 | ............. | F02M 51/06 |
| JP | 7249802 A | 9/1995 | | |
| JP | 8275563 A | 10/1996 | | |
| JP | 2001230461 A | 8/2001 | | |
| JP | 2002058261 A | 2/2002 | | |
| JP | 2002532658 A | 10/2002 | | |
| JP | 2005124272 A | 5/2005 | | |
| WO | 2006103192 A | 10/2006 | | |

OTHER PUBLICATIONS

European Search Report, European Patent Appln. No. 11820024.5, May 20, 2014, 5 pp.

* cited by examiner

PIEZOELECTRIC ACTUATOR FOR SUPPRESSING DISCONNECTION

FIELD OF INVENTION

The present invention relates to a piezoelectric actuator to be used in devices such as a fuel injection device for automotive engines, a liquid injection device such as an inkjet, and a positioning device for precisely positioning an XY table.

BACKGROUND

As an example of piezoelectric actuators, there is known a piezoelectric actuator in which a piezoelectric element including a columnar laminated body and a pair of external electrodes is enclosed in a metallic container, the columnar laminated body being formed by laminating piezoelectric layers and internal electrode layers, and the external electrodes being disposed on side faces of the laminated body in a laminated direction and alternately and electrically connected to every other internal electrode layer (see Patent Literature 1, for example).

CITATION LIST

Patent Literature

Patent Literature 1: Japanese Unexamined Patent Publication JP-A 2002-58261

SUMMARY

Technical Problem

The piezoelectric actuator described above is configured by enclosing the piezoelectric element in the metallic container with a compressive load applied to the piezoelectric element so that the piezoelectric element is always under compressive stress, the container having been formed by welding members such as a base body and a case by laser welding or resistance welding.

Figure 6:
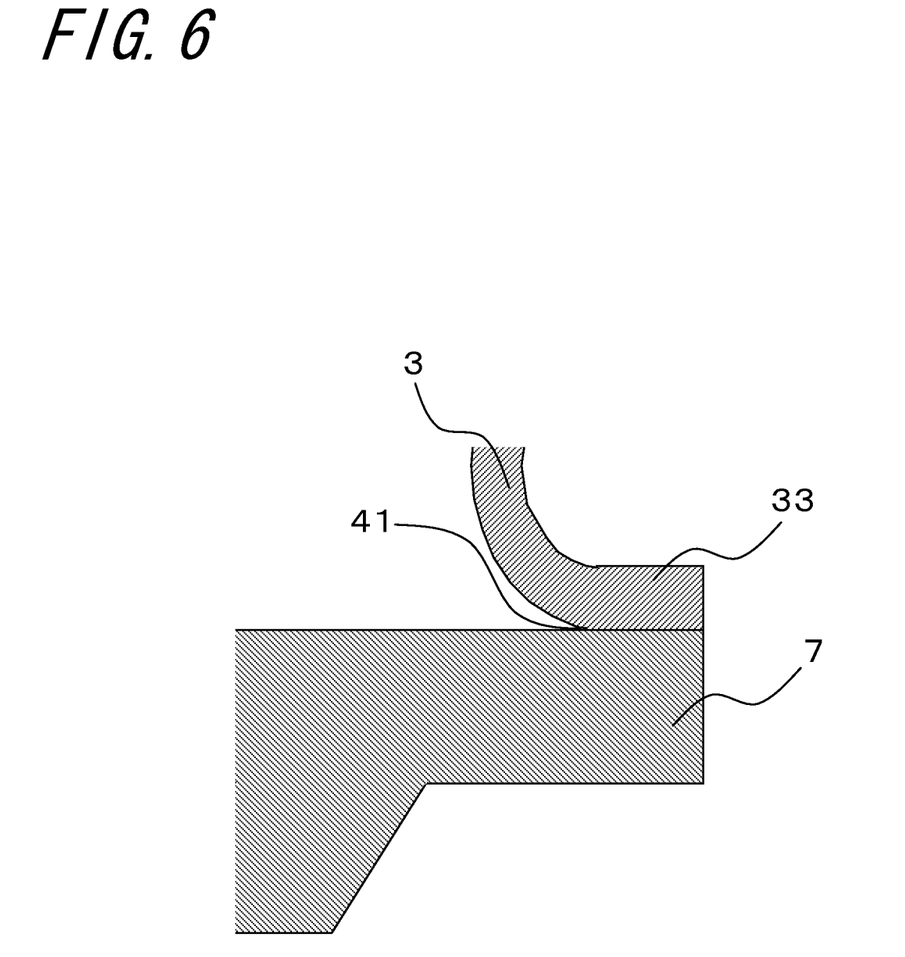
FIG. 6 is an enlarged view of a main part of a conventional piezoelectric actuator.

Accordingly, a junction (welded portion) of the container is always under tensile stress and, for example, if the configuration is such that stress is concentrated at a single place (bent portion 41) of the junction (welded portion) when the junction (welded portion) is viewed in cross section as shown in FIG. 6, there is a problem in that the junction (welded portion) may be disconnected due to repeated application of tensile stress.

The invention has been conceived in view of the above-described problems, and it is an object of the invention to provide a piezoelectric actuator capable of suppressing disconnection of a junction due to tensile stress.

Solution to Problem

The invention provides a piezoelectric actuator including: a piezoelectric element, a base body having an upper face on which a lower end of the piezoelectric element abuts, and a case having an inner face on which an upper end of the piezoelectric element abuts, the case being configured to enclose the piezoelectric element, wherein the case includes a flange portion configured to be joined to the base body, and at least two bent portions are present on an inner face that is formed from a lower face of the flange portion of the case to the upper face of the base body on an enclosure space side of a junction between the case and the base body.

In the piezoelectric actuator with the above-described configuration, it is preferable that the piezoelectric actuator includes a ring-shaped portion disposed between the lower face of the flange portion and the upper face of the base body, at least one of an upper face and a lower face of the ring-shaped portion serving as a junction with the lower face of the flange portion or the upper face of the base body.

In the piezoelectric actuator with the above-described configuration, it is preferable that a width of the ring-shaped portion on a side of the upper face thereof is smaller than a width of the ring-shaped portion on a side of the lower face thereof.

In the piezoelectric actuator with the above-described configuration, it is preferable that an angle formed by a side face of the ring-shaped portion on the enclosure space side and the lower face of the flange portion is an acute angle.

In the piezoelectric actuator with the above-described configuration, it is preferable that a material of the ring-shaped portion is different from materials of the base body and the case.

Advantageous Effects of Invention

The piezoelectric actuator of the invention with two or more stress concentration places is capable of suppressing disconnection of a junction due to tensile stress. Accordingly, long-term stable driving of the piezoelectric actuator is possible.

DETAILED DESCRIPTION OF THE PREFERRED EMBODIMENTS

Hereinafter, exemplary embodiments of a piezoelectric actuator of the invention will be described with reference to the drawings.

Figure 1:
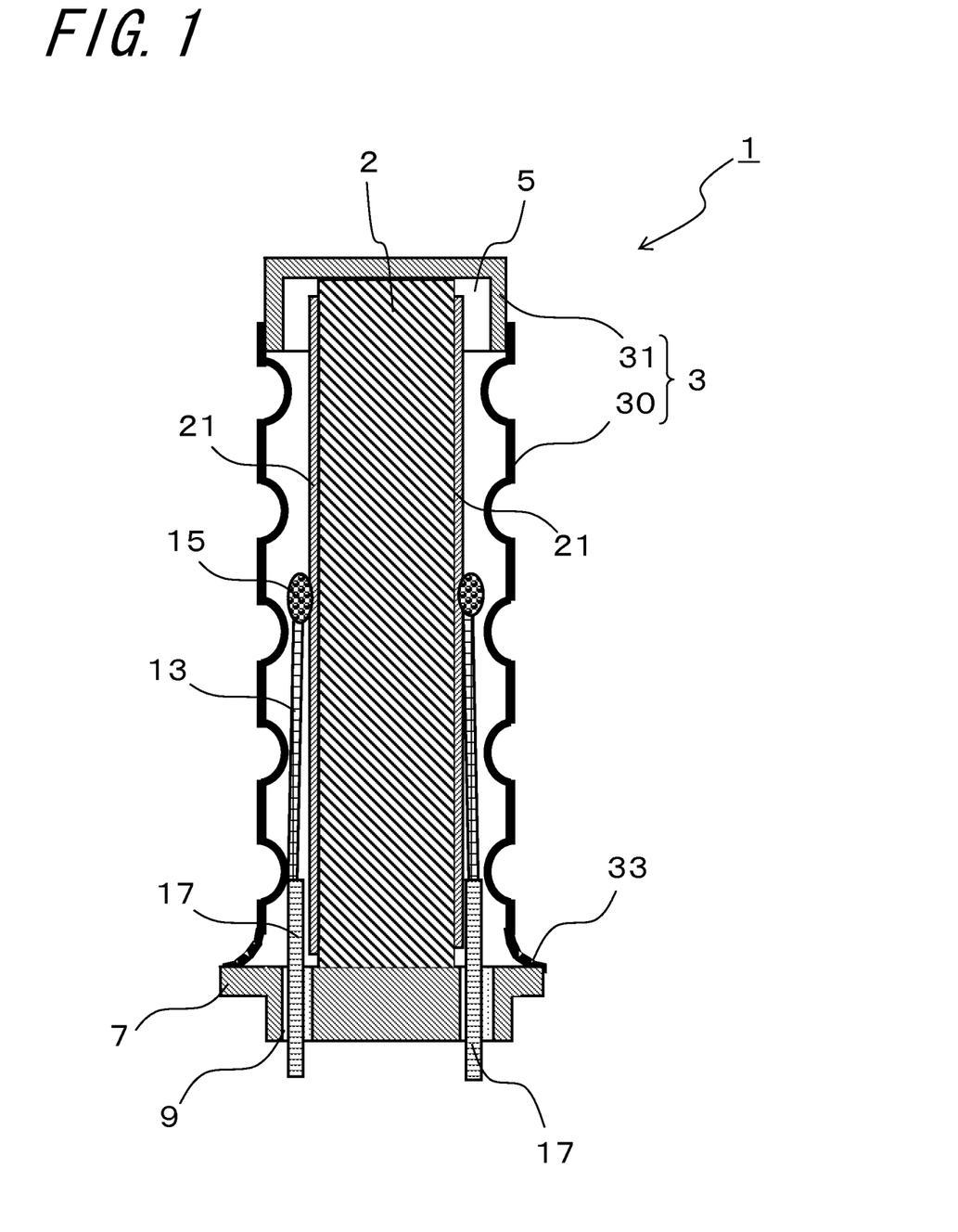
FIG. 1 is a cross-sectional view showing an example of an embodiment of a piezoelectric actuator according to the invention.
Figure 2:
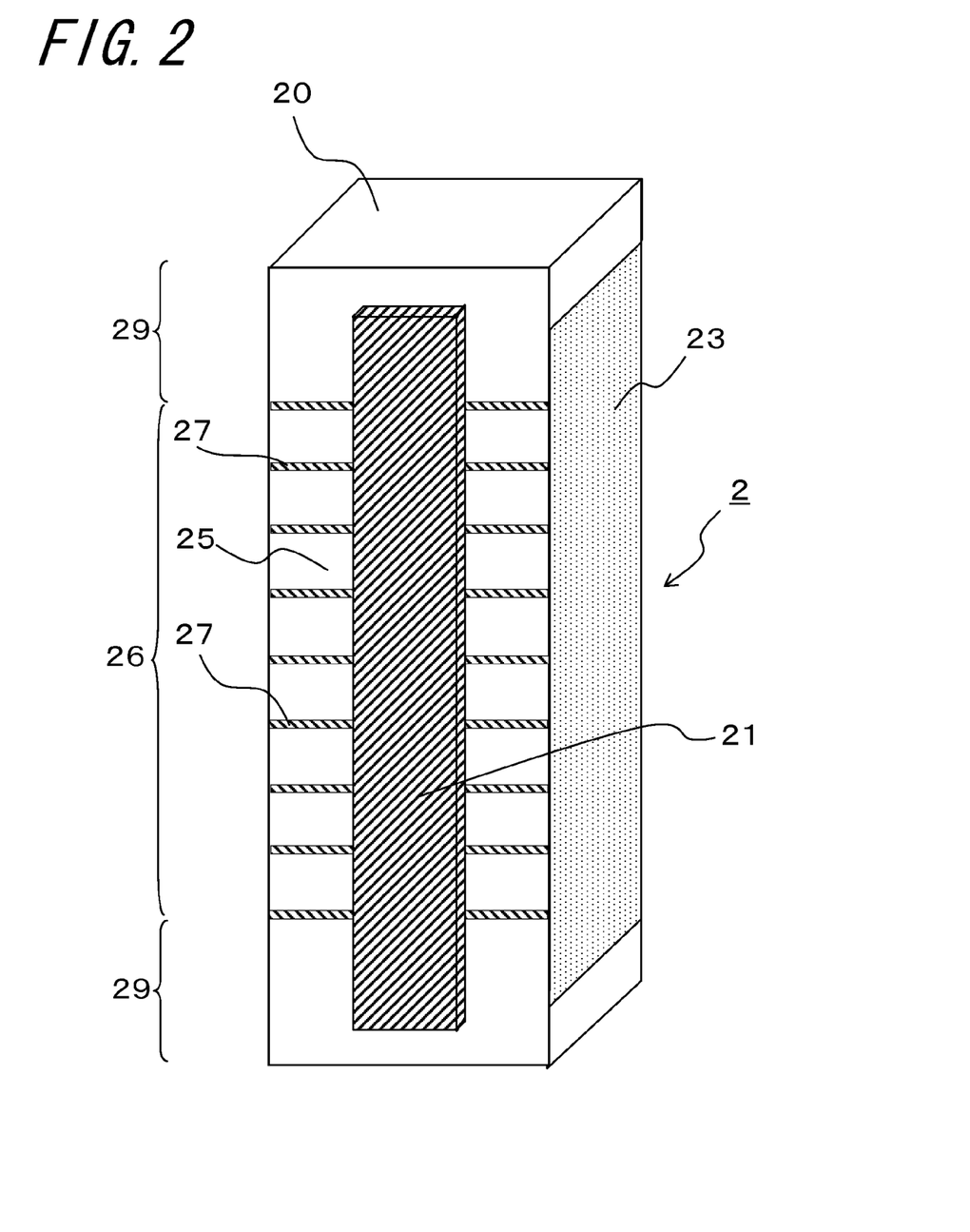
FIG. 2 is a schematic perspective view of a piezoelectric element shown in FIG. 1.

FIG. 1 is a cross-sectional view showing an example of an embodiment of a piezoelectric actuator according to the invention, and FIG. 2 is a schematic perspective view of a piezoelectric element shown in FIG. 1.

A piezoelectric actuator 1 shown in FIG. 1 includes a piezoelectric element 2, a base body 7 having an upper face on which a lower end of the piezoelectric element 2 abuts, and a case 3 having an inner face on which an upper end of the piezoelectric element 2 abuts, the case 3 being configured to enclose the piezoelectric element 2. The case 3 includes a flange portion 33 configured to be joined to the base body 7, and at least two bent portions 41 are present on an inner face that is formed from a lower face of the flange portion 33 of the case 3 to the upper face of the base body 7 on an enclosure space side of a junction 4 between the case 3 and the base body 7.

The piezoelectric element 2 is, as shown in FIG. 2, a laminated piezoelectric element that includes, for example, a laminated body 20 having an active portion 26 and an inactive portion 29, the active portion 26 being formed by alternately laminating piezoelectric layers 25 and internal electrode layers 27, and the inactive portion 29 being formed of piezoelectric layers 25 that are laminated on the opposite ends of the active portion 26 in a laminated direction. Here, the active portion 26 is a portion in which the piezoelectric layers 25 extend and contract in the laminated direction during driving, and the inactive portion 29 is a portion in which the piezoelectric layers 25 neither extend nor contract in the laminated direction during driving.

The laminated body 20 constituting the piezoelectric element 2 is formed in the shape of a rectangular parallelepiped of, for example, approximately 4 to 7 mm in length, 4 to 7 mm in width, and 20 to 50 mm in height. Note that although the laminated body 20 shown in FIG. 2 has a rectangular-prism shape, it may have a shape of, for example, a hexagonal prism or an octagonal prism.

A plurality of piezoelectric layers 25 constituting the laminated body 20 is formed of piezoelectric ceramics having a piezoelectric property, the piezoelectric ceramics having an average particle diameter of, for example, 1.6 to 2.8μm. Examples of the piezoelectric ceramics that may be used include a perovskite oxide made of $PbZrO_3$—$PbTiO_3$ (PZT: lead zirconate titanate) or the like, lithium niobate ($LiNbO_3$), and lithium tantalate ($LiTaO_3$).

The internal electrode layers 27 are formed of, for example, silver, a silver-palladium alloy, silver-platinum, or copper, and their positive electrodes and negative electrodes (or ground electrodes) are respectively led to a pair of opposite side faces of the laminated body 20 alternately. With this configuration, in the active portion 26, a driving voltage is applied to each piezoelectric layer 25 sandwiched between each pair of adjacent internal electrode layers 27 in the laminated direction.

Note that the laminated body 20 may include, for example, a metal layer that is a layer for relaxing stress and does not function as an internal electrode layer 27.

Then, external electrodes 21 are disposed on a pair of opposite side faces of the laminated body 20 to which the positive electrodes and negative electrodes (or ground electrodes) of the internal electrode layers 27 are alternately led, and to which the electrode layers 27 are joined. The external electrodes 21 are, for example, metalized layers formed of a sintered body of silver and glass and are electrically connected to the internal electrode layers 27. Note that, as shown in FIG. 1, lead wires 13 are attached to the external electrodes 21 with solder 15, and a driving voltage is applied via the lead wires 13.

Meanwhile, both the positive electrodes and negative electrodes (or ground electrodes) of the internal electrode layers 27 are exposed on the other pair of opposite side faces of the laminated body 20, and covering layers 23 formed of an oxide are formed on these side faces. Forming the covering layers 23 makes it possible to prevent creeping discharge that may occur between both of the electrodes when a high voltage is applied during driving. One example of the oxide forming the covering layers 23 is a ceramic material, and in particular, the oxide is preferably a material that can follow driving deformation (extension and contraction) of the laminated body 2 when driving the piezoelectric actuator and that can be deformed under stress in order to prevent the possibility that creeping discharge may occur as a result of the covering layers 23 becoming detached. Specific examples include ceramic materials such as partially stabilized zirconia and $Ln_{1-x}Si_xAlO_{3+0.5x}$ (where Ln is at least one selected from the group consisting of Sn, Y, La, Ce, Pr, Nd, Pm, Sm, Eu, Gd, Tb, Dy, Ho, Er, Tm, and Yb, and x=0.01 to 0.3) that are deformable as a result of undergoing local phase transformation and volume change upon stress, and piezoelectric materials such as barium titanate and lead zirconate titanate (PZT) in which interionic distances in the crystalline lattice vary in order to relax the stress generated. The covering layers 23 are formed by, for example, after processing a material into the form of ink, applying the ink to the side faces of the laminated body 20 by dipping or screen printing and then sintering the ink.

The piezoelectric actuator shown in FIG. 1 includes the base body 7 having an upper face on which the lower end of the piezoelectric element 2 abuts, and the case 3 having an inner face on which the upper end of the piezoelectric element 2 abuts, the case 3 being configured to enclose the piezoelectric element.

Specifically, the base body (lower lid member) 7 is formed in the shape of a circular plate and formed of a metal material such as SUS 304 or SUS 316L and has a thin peripheral edge in the drawing. The base body 7 has two through holes formed therein so that lead pins 17 are able to be inserted therethrough. By inserting the lead pins 17, which are electrically connected to the lead wire 13, through the through holes, electrical conduction between the external electrodes 21 and an external device is achieved. Also, soft glass 9 is filled in gaps in the through holes in order to fix the lead pins 17 and to prevent the entry of outside air.

The case 3 is also formed of a metal material such as SUS 304 or SUS 316L, like the base body 7, and includes a cylindrical body 30 and a lid member (upper lid member) 31 provided to plug up a one-end-side opening of the cylindrical body 30.

Specifically, the cylindrical body 30 that makes up the case 3 is formed by first producing a seamless tube of a predetermined shape and then deforming the tube into a bellows shape by rolling, hydrostatic pressing, or the like. The cylindrical body 30 has a predetermined spring constant so as to be able to follow the extension and contraction of the piezoelectric element 2 (laminated body 20) when a voltage is applied to the piezoelectric element 2, and the spring constant is adjusted depending on thickness and the shape and number of grooves. While the one-end-side opening of the cylindrical body 30 is formed in a cylindrical shape, an other-end-side opening of the cylindrical body 30 is formed in a so-called trumpet shape that expands outwardly in the radial direction. In this way, forming the trumpet-shaped other-end-side opening of the cylindrical body 30 allows the case 3 (cylindrical body 30) to be configured with the flange portion 33.

The lid member 31 that makes up the case 3 is a cap-like member that is formed to have an outer diameter approximately the same as the inner diameter of the cylindrical body 30. The lid member is fitted in the one-end-side opening of the cylindrical body 30, with its outer periphery being welded to an inner wall in the vicinity of the one-end-side opening.

Note that the cylindrical body 30 and the lid member 31 may be formed as separate members and welded together, or they may be formed as a single member.

Figure 3:
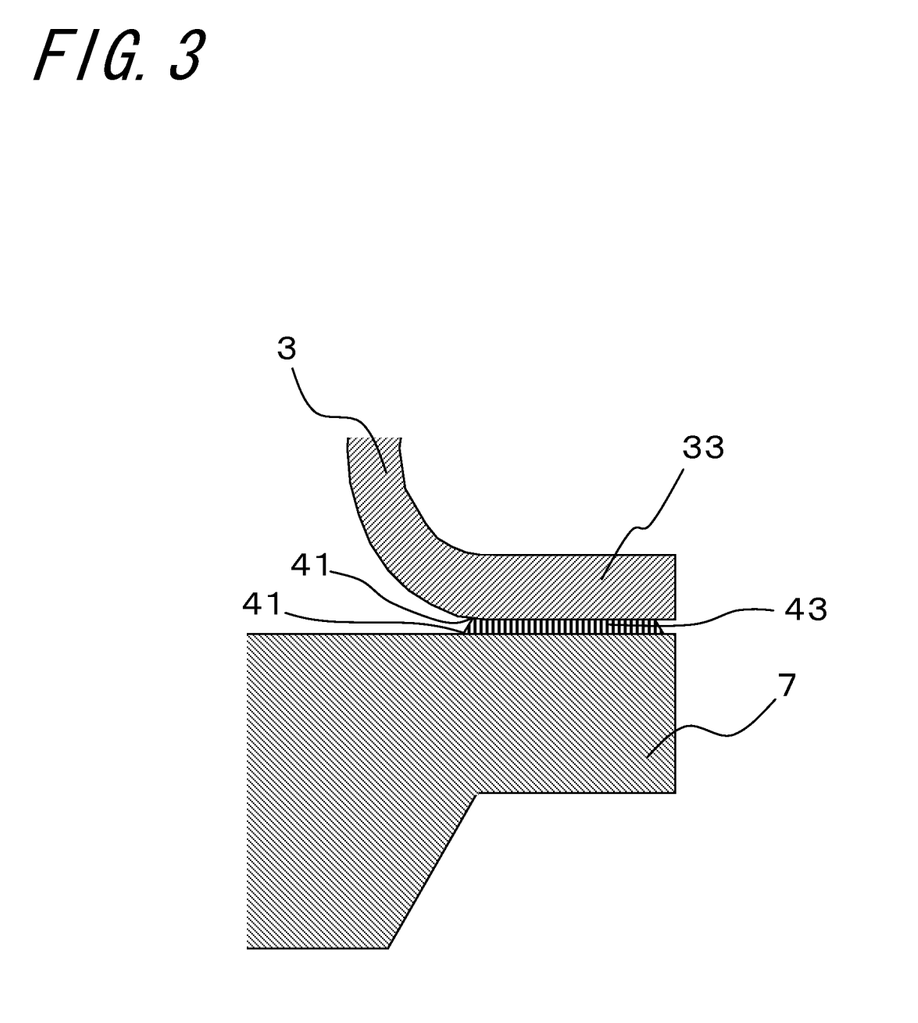
FIG. 3 is an enlarged view of a main part of the piezoelectric actuator shown in FIG. 1.
Figure 4:
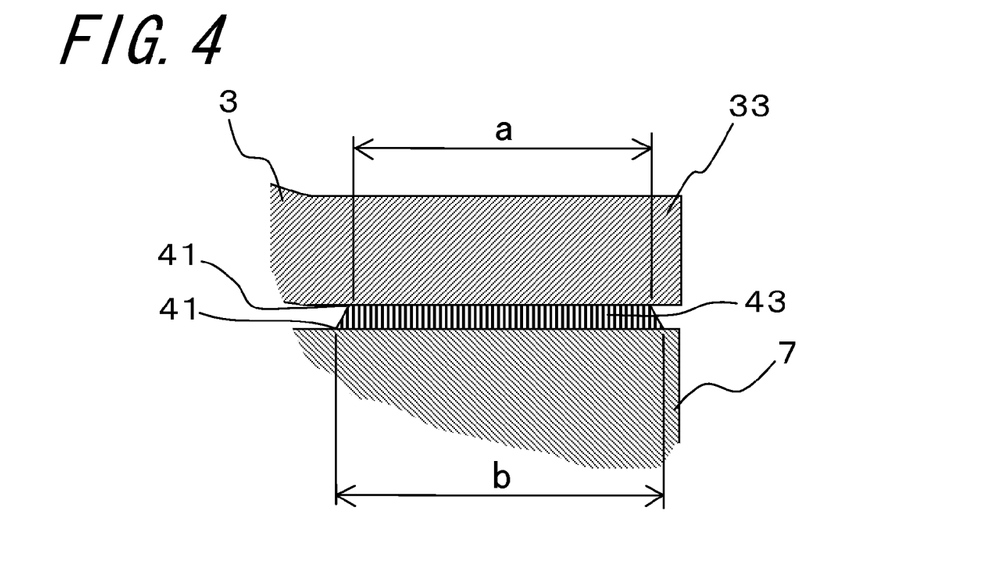
FIG. 4 is a diagram illustrating a ring-shaped portion shown in FIG. 3.

As shown in FIGS. 3 and 4, the case 3 (cylindrical body 30) includes the flange portion 33 that is joined to the base body 7, and at least two bent portions 41 are present on an inner face that is formed from the lower face of the flange portion 33 of the case 3 to the upper face of the base body 7 on the enclosure space side of the junction between the case 3 and the base body 7.

In this case, with a compressive load applied to the piezoelectric element 2, the flange portion 33 of the case 3 and the base body 7 are welded together and the piezoelectric element 2 is enclosed together with an inert gas in the enclosure space formed by the case 3 and the base body 7. This constitutes the piezoelectric actuator 1.

In the configuration in which the flange portion 33 of the case 3 and the base body 7 are welded together as shown in FIG. 6, the resultant shape is such that stress is concentrated at a single bent portion 41 (one point). Thus, there is the possibility that the junction may be disconnected due to tensile stress during use. In contrast, in the configuration of an embodiment of the invention shown in FIG. 3 in which at least two bent portions 41 are present on the inner face formed from the lower face of the flange portion 33 of the case 3 to the upper face of the base body 7 on the enclosure space side of the junction between the case 3 and the base body 7, it is possible to suppress disconnection of the junction due to tensile stress because there are two or more stress concentration points. Accordingly, the piezoelectric actuator 1 can be stably driven over a long period of time. Note that, although it depends on the material of a ring-shaped portion 43, which will be described later, it is more effective for the two bent portions 41 to be spaced 0.05 mm or more away from each other in terms of suppressing disconnection of the junction due to tensile stress.

Here, in order to achieve the above-described configuration, it is preferable that the piezoelectric actuator 1 has the ring-shaped portion 43 disposed between the lower face of the flange portion 33 and the upper face of the base body 7, at least one of an upper face and a lower face of the ring-shaped portion serving as a junction with the lower face of the flange portion 33 or the upper face of the base body 7. Having the ring-shaped portion 43 serving as a ring-shaped junction provides two or more stress concentration points, when viewed in cross section, in the entire area sandwiched between the lower face of the flange portion 33 of the case 3 and the upper face of the base body 7, and in addition, forming that portion in a ring shape makes it possible to prevent disconnection of the junction due to tensile stress. Note that although there are just two bent portions as shown in FIGS. 3 and 4 if there is no level difference in the side wall of the ring-shaped portion 43, it is also possible to obtain two or more bent portions 41 by providing a plurality of level differences in the side wall of the ring-shaped portion 43.

The ring-shaped portion 43 can be integrally formed with the base body 7 by cutting the base body 7. In this configuration, it is preferable that a width a of the ring-shaped portion 43 on a side of the upper face thereof is smaller than a width b on a side of the lower face thereof when viewed in cross section, as shown in FIG. 4. For example, the ring-shaped portion 43 is formed such that the upper-face-side width a is approximately 0.2 to 0.48 mm, the lower-face-side width b is approximately 0.5 to 0.7 mm, and the thickness is approximately 0.05 to 0.2 mm. Setting the upper-face-side width a of the ring-shaped portion 43 to be smaller than the lower-face-side width b of the ring-shaped portion 43 improves the spring effect of the junction and allows deformation with respect to displacement of the piezoelectric actuator 1 to occur not only in the cylindrical body 30 but also in this portion, thus preventing plastic deformation of the cylindrical body 30. In particular, it is preferable that the ring-shaped portion 43 is formed in the shape of a trapezoid as shown in FIG. 4. As a result, it is possible to prevent reduction of load in the piezoelectric actuator 1 associated with the plastic deformation of the cylindrical body 30 and to drive the piezoelectric actuator 1 without reducing the amount of displacement even after long use.

Figure 5:
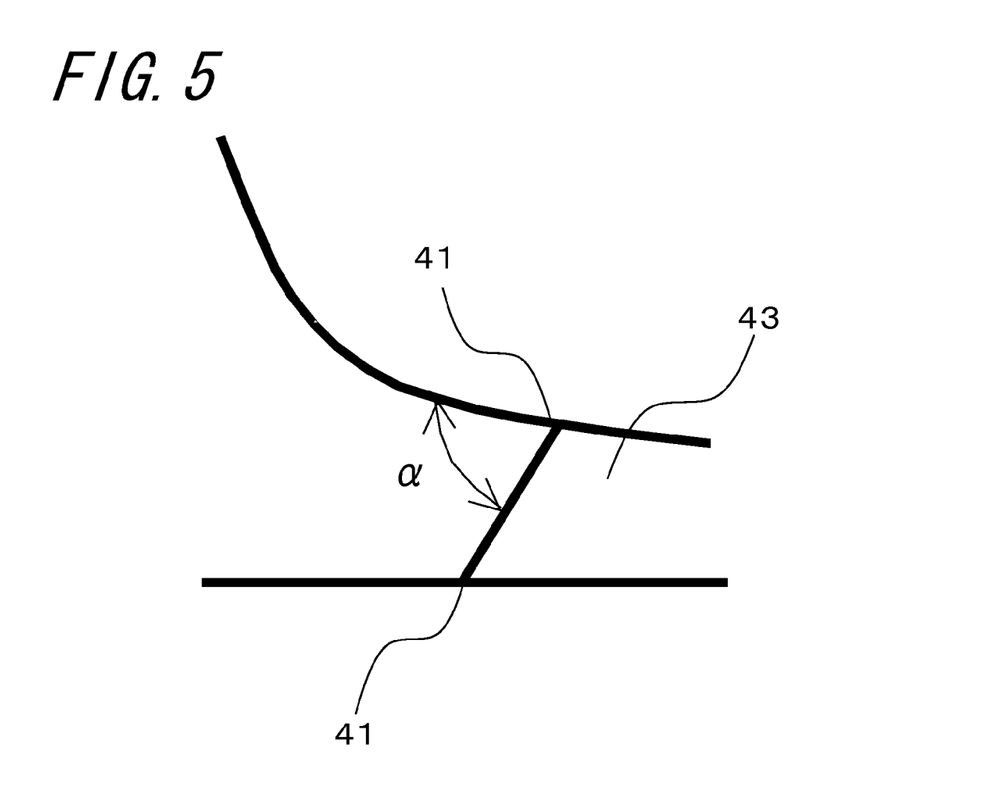
FIG. 5 is an enlarged view of the vicinity of a bent portion shown in FIGS. 3 and 4.

It is also preferable in the above-described configuration that an angle a formed by a side face of the ring-shaped portion 43 on the enclosure space side and the lower face of the flange portion 33 is an acute angle as shown in FIG. 5. Making the angle a formed by the side face of the ring-shaped portion 43 on the enclosure space side and the lower face of the flange portion 33 acute allows deformation with respect to displacement of the piezoelectric actuator 1 to occur not only in the cylindrical body 30 but also in this portion, thus preventing plastic deformation of the cylindrical body 30. As a result, it is possible to prevent the reduction of load in the piezoelectric actuator 1 associated with the plastic deformation of the cylindrical body 30 and to drive the piezoelectric actuator 1 without reducing the amount of displacement even after long use.

A material to be used for the ring-shaped portion 43 may be different from those of the base body 7 and the case 3 (cylindrical body 30). Using a different material from the base body 7 and the case 3 (cylindrical body 30) allows the ring-shaped portion 43 to function as an intermediate layer, which allows relaxation of stress. As a result, it is possible to suppress disconnection of the junction due to tensile stress and to stably drive the piezoelectric actuator 1 over a long period of time. Note that the material of the ring-shaped portion 43 in this case is preferably a material that is softer than the base body 7 and the cylindrical body 30, and examples of the material include copper, phosphor bronze, and Kovar (Fe—Ni—Co alloy). In this case as well, the ring-shaped portion 43 is preferably in the shape as described above.

Next is a description of a method for manufacturing the piezoelectric actuator 1 according to the embodiment.

First, a ceramic green sheet to be a piezoelectric layer 25 is produced. Specifically, calcined powder of piezoelectric ceramics, a binder made of acrylic, butyral, or like organic polymers, and a plasticizer are mixed so as to produce ceramic slurry. Then, a ceramic green sheet is produced from this ceramic slurry using a tape casting process such as a well-known doctor blade method or calender roll method. As the piezoelectric ceramics, any material that has a piezoelectric property may be used, and for example, a perovskite oxide composed of $PbZrO_3$—$PbTiO_3$ or the like may be used. Examples of the plasticizer used include dibutyl phthalate (DBP) and dioctyl phthalate (DOP).

Next, a conductive paste to be an internal electrode layer 27 is produced. Specifically, a binder and a plasticizer are added to and mixed with a metal powder of silver-palladium alloy so as to produce a conductive paste. This conductive paste is printed on the above-described ceramic green sheet using screen printing. Then, a plurality of ceramic green sheets with the conductive paste printed thereon are laminated, and also, a plurality of ceramic green sheets on which no conductive paste is printed are laminated on both ends in the laminated direction. Accordingly, a laminated compact is obtained. This laminated compact is subject to de-binding processing at a predetermined temperature and is then fired at a temperature of 900 to 1200° C. so as to obtain a laminated body 20.

Then, an ink of oxides is printed by screen printing on a pair of side faces of the laminated body 20 to which both of the internal electrode layers 27 (positive and negative electrodes) are led, and is then fired at a temperature of 900 to 1200° C. so as to form the covering layers 23.

The ink of oxides is produced by first dispersing a powder of oxides in a solution of a solvent, a dispersant, a plasticizer, and a binder and then passing three rolls several times so as to pulverize aggregation of the powder as well as dispersing the powder.

Next, the external electrodes 21 made of a metalized layer are formed. First, a binder is added to silver particles and glass powder so as to produce a conductive paste containing silver glass. Then, the conductive paste is printed by screen printing on a pair of opposite side faces of the laminated body 20 to which the positive electrodes and negative electrodes of the internal electrode layers 27 are led, and is then subjected to baking processing at a temperature of approximately 500 to 800° C. As a result, the external electrodes 21 made of a metalized layer are formed, and thus the piezoelectric element 2 is completed.

Then, the external electrodes 21 and the lead wires 13 are soldered to each other. Also, the base body (lower lid member) 7 having a shape as shown in FIG. 1 is prepared by forming the ring-shaped portion 43 by cutting as well as forming the through holes by hole machining. The lead pins 17 are inserted through the two through holes formed in the base body (lower lid member) 7, the gap is filled with the soft glass 9 so that the lead pins 17 is fixed, and furthermore, the lower end of the piezoelectric element 2 is bonded to the upper face of the base body 7 with an adhesive. Then, the lead wires 13 soldered to the external electrodes 21 of the piezoelectric element 2 with the solder 15 and the lead pins 17 attached to the base body 7 are connected with solder.

Then, the cylindrical body 30 made of SUS 316L and having a seamless cylindrical shape, for example, is formed into a bellows shape by rolling, and the lid member (upper lid member) 31 made of SUS 304 is welded by laser welding so as to plug up the opening of the cylindrical body 30 on the one end side (upper end side). As a result, the case 3 is produced. Note that the flange portion 33 is formed on the other end side (lower end side) of the cylindrical body 30.

Then, the case 3 is placed so as to cover the piezoelectric element 2 bonded to the base body 7 and is pulled with a predetermined load so as to apply a load to the piezoelectric element 2. In this condition, the flange portion 33 of the case 3 and the upper face of the ring-shaped portion 43 provided on the base body 7 are welded by resistance welding so as to enclose the piezoelectric element. Note that if a material which is different from that of the base body is used for the ring-shaped portion 43, it is sufficient that a ring to be the ring-shaped portion 43 is provided, the upper face of the ring is welded to the flange portion 33, and the lower face of the ring is welded to the base body 7.

Then, a hole for introducing an inert gas is drilled in a predetermined position of the case 3, and after an inside of the case (enclosure space) is drained of oxygen by creating a vacuum in a vacuum chamber, a nitrogen gas is introduced in the vacuum chamber and nitrogen purging is conducted in the inside of the case (enclosure space). Thereafter, the hole for introducing an inert gas is welded by laser welding and thereby plugged up.

Lastly, a DC electric field of 0.1 to 3 kV/mm is applied to the lead pins 11 attached to the base body 7, and the laminated body 20 is polarized so as to complete the piezoelectric actuator 1 of the embodiment. Then, the lead pins 17 are connected to an external power supply and a voltage is applied to the piezoelectric layers 25, as a result of which the piezoelectric layers 25 can be greatly displaced by the inverse piezoelectric effect. Accordingly, the piezoelectric actuator can function as, for example, a fuel injection valve for automobiles that injects and supplies fuel to an engine.

The laminated piezoelectric element of the embodiment is utilized as, for example, a fuel injection device for automotive engines, a liquid injection device such as an inkjet, or a positioning device for precisely positioning an optical device.

EXAMPLES

As a first example of the invention, a piezoelectric actuator was produced as described below.

First, ceramic slurry was produced by mixing calcined powder of piezoelectric ceramics that was primarily composed of lead zirconate titanate ($PbZrO_3$—$PbTiO_3$) having an average particle size of 0.4μm, a binder, and a plasticizer, and then a ceramic green sheet to be a piezoelectric layer having a thickness of 150μm was produced by the doctor blade method.

A conductive paste to be an internal electrode, which was produced by adding a binder to a silver-palladium alloy (95 mass % of -5 mass % of palladium), was printed on one side of the ceramic green sheet by screen printing, and 300 ceramic green sheets thus obtained were laminated so as to produce a laminated compact.

Next, after the laminated compact was cut into a predetermined size with a dicing saw machine, the laminated compact was dried and fired so as to produce a laminated body. The firing was conducted such that the laminated compact was held at a temperature of 800° C. for 90 minutes and then fired at a temperature of 1000° C. for 200 minutes. The resultant laminated body had a shape of a rectangular parallelepiped whose end faces were each 5 mm in length and 5 mm in width and whose height was 35 mm.

Then, an ink made of partially stabilized zirconia, a piezoelectric material, the same material as the piezoelectric layers, and lead zirconate titanate was produced, and the ink was printed by screen printing on side faces of the laminated body on which both electrodes of the internal electrode layers were exposed, so that coating layers had a thickness of 20μm. The ink was then fired at a temperature of 1000° C. so as to form the coating layers on the side faces of the laminated body.

Then, a conductive paste containing silver glass was produced by adding a binder to silver particles and glass powder, and the paste was printed on side faces of the laminated body by screen printing and baked at a temperature of approximately 500 to 800° C. so as to form external electrodes. Thereafter, lead wires were connected to the external electrodes by soldering.

Meanwhile, a disc-shaped base body was produced from SUS 304. Specifically, a base body having a shape shown in FIG. 1 was produced by forming a ring-shaped portion by cutting and forming through holes in two places. Then, lead pins were inserted through the through holes formed in the base body, and fixed using soft glass. Note that the specifications of the ring-shaped portion, namely, the upper-face-side width a of the ring-shaped portion, and the lower-face-side width b of the ring-shaped portion, and the angle a formed by the side face of the ring-shaped portion on the enclosure space side and the lower face of the flange portion, are as shown in Table 1 described later. Also, the ring-shaped portion had a thickness of 0.1 mm.

Then, the laminated body was fixed to the upper face of the base body with an adhesive, and the lead wires soldered to the external electrodes and the lead pins attached to the base body were connected by soldering.

Then, a cap-like upper lid member was produced from SUS 304. Also, a case formed by fitting an upper lid member into a cylindrical body and welding them together by laser welding, the cylindrical body formed by deforming a seamless cylinder made of SUS 316L into a bellows shape by rolling, was placed to cover the piezoelectric element bonded to the base body (lower lid member), and after a load was applied to the piezoelectric element by pulling the case with a predetermined load, the area of contact between the case and the ring-shaped portion of the base body was welded by resistance welding so as to enclose the piezoelectric element.

Then, a hole for introducing an inert gas was drilled in a predetermined position of the case, and after an inside of the case (enclosure space) was drained of oxygen by creating a vacuum in a vacuum chamber, a nitrogen gas was introduced into the vacuum chamber and nitrogen purging was conducted in the inside of the case (enclosure space). Thereafter, the hole for introducing an inert gas was welded by laser welding and thereby plugged up. This completes nitrogen purging.

As a second example of the invention, a sample that uses another material for the ring-shaped portion was produced. Specifically, a ring made of Kovar was produced. Then, the ring was sandwiched between the flange portion of the case and the base body, and the area of contact between the members was welded by resistance welding so as to provide a seal.

Moreover, a sample that does not include a ring-shaped portion was produced as a comparative example, and the flange portion of the case and the base body were welded together by resistance welding.

Lastly, a poling process was conducted by applying a DC electric field of 3 kV/mm to the two lead pins of each sample for 15 minutes, so as to produce a piezoelectric actuator.

When a DC voltage of 170 V was applied to the laminated bodies of the respective resultant piezoelectric actuators, all the piezoelectric actuators exhibited displacement in the laminated direction.

Moreover, a test for high-temperature continuous operation in which a DC voltage of 250 V is continuously applied to an apparatus in an environment with a temperature of 150° C. was conducted on these piezoelectric actuators. The result is shown in Table 1.

On the other hand, the piezoelectric actuator (Sample No. 3) of the comparative example stopped after 39 hours of operation. After checking this sample, it was found that the junction was disconnected. In addition, a deviated load associated with the disconnection of the junction had caused cracks in the piezoelectric element.

REFERENCE SIGNS LIST

1: Piezoelectric actuator
2: Piezoelectric element
3: Case
5: Insulating material
7: Base body
9: Soft glass
13: Lead wire
15: Solder
17: Lead pin
20: Laminated body
21: External electrode
23: Covering layer
25: Piezoelectric layer
26: Active portion
27: Internal electrode layer
29: Inactive portion
30: Cylindrical body
31: Lid member
33: Flange portion
41: Bent portion
43: Ring-shaped portion

What is claimed is:
1. A piezoelectric actuator, comprising:
a piezoelectric element;
a base body having an upper face on which a lower end of the piezoelectric element abuts;

TABLE 1

| | Material | | | Specifications of Ring-Shaped Portion | | | | Amount of Displacement | | Damage |
| | | | | | Upper-Face-Side Width a of | Lower-Face-Side Width b of | | | | |
| Sample No. | Cylindrical Body | Base body | Ring-Shaped Portion | Number of Bent Portions | Ring-Shaped Portion | Ring-Shaped Portion | Angle α | Initial Stage | After 500 Hrs | to Junction |
|---|---|---|---|---|---|---|---|---|---|---|
| 1 | SUS 316L | SUS 304 | SUS 304 | 2 | 0.4 mm | 0.5 mm | 60° | 51.8 | 51.9 | None |
| 2 | SUS 316L | SUS 304 | Kovar | 2 | 0.4 mm | 0.5 mm | 60° | 52.1 | 52.0 | None |
| *3 | SUS 316L | SUS 304 | — | 1 | — | — | — | 51.7 | Stopped after 39 hours of operation | Disconnection of Junction |

Asterisk (*) indicates sample out of scope of the invention

It can be seen from Table 1 that the piezoelectric actuators (Sample Nos. 1 and 2) of the examples of the invention exhibited little change in the amount of displacement even after the test of continuously applying voltage for 500 hours, maintained the effective amount of displacement required as piezoelectric elements, did not suffer disconnection of the junction, and thus can offer a stable amount of displacement even after long use.

a case having an inner face on which an upper end of the piezoelectric element abuts, the case being configured to enclose the piezoelectric element;

the case comprising a flange portion having a lower face facing the upper face of the base body, and a ring-shaped portion which joins the upper face of the based body to the lower face of the flange portion, at least two bent portions being present on an inner face which reaches from the lower face of the flange portion of the case across a side face of the ring-shaped portion to the upper face of the base body.

2. The piezoelectric actuator according to claim 1, wherein a width of the ring-shaped portion on a side of the upper face thereof is smaller than a width of the ring-shaped portion on a side of the lower face thereof.

3. The piezoelectric actuator according to claim 1, wherein an angle formed by a side face of the ring-shaped portion on the enclosure space side and the lower face of the flange portion is an acute angle.

4. The piezoelectric actuator according to claim 1, wherein a material of the ring-shaped portion is different from materials of the base body and the case.

* * * * *